United States Patent
Akiyoshi (10) Patent No.: US 10,761,364 B2
(45) Date of Patent: Sep. 1, 2020

(54) LIQUID CRYSTAL DISPLAY DEVICE

(71) Applicant: Japan Display Inc., Minato-ku (JP)

(72) Inventor: Muneharu Akiyoshi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/101,666

(22) Filed: Aug. 13, 2018

(65) Prior Publication Data

US 2019/0056620 A1 Feb. 21, 2019

(30) Foreign Application Priority Data

Aug. 18, 2017 (JP) ................. 2017-157824

(51) Int. Cl.
*G02F 1/1343* (2006.01)
*G02F 1/1362* (2006.01)
(Continued)

(52) U.S. Cl.
CPC ...... *G02F 1/133514* (2013.01); *G02F 1/1368* (2013.01); *G02F 1/133345* (2013.01);
(Continued)

(58) Field of Classification Search
CPC ...... G02F 1/136; G02F 1/1333; G02F 1/1335; G02F 1/1368; G02F 1/136227; G02F 1/133345; G02F 1/133512; G02F 1/134363; G02F 1/136286; G02F 1/133514; G02F 1/136209; G02F 1/133707; G02F 1/13439; G02F 1/134309; G02F 1/134336; G02F 1/1343; G02F 1/1362; G02F 2201/123; G02F 2201/121; G02F 2001/134372; G02F 2001/136222; G02F 2001/133357; G02F 2001/13629; G02F 2001/13685; G02F 2001/1351; H01L 29/78633; H01L 29/41733; H01L 27/124; H01L 27/3248; H01L 27/3272; H01L 27/3262;
(Continued)

(56) References Cited

U.S. PATENT DOCUMENTS

| | | | |
|---|---|---|---|
| 2015/0022766 A1* | 1/2015 | Kim | G02F 1/13394 349/106 |
| 2015/0062521 A1* | 3/2015 | Son | G02F 1/133345 349/138 |
| 2018/0217432 A1* | 8/2018 | Mori | G02F 1/133512 |

FOREIGN PATENT DOCUMENTS

JP 2002-350886 12/2002

* cited by examiner

*Primary Examiner* — Thoi V Duong
(74) *Attorney, Agent, or Firm* — Oblon, McClelland, Maier & Neustadt, L.L.P.

(57) ABSTRACT

A liquid crystal display device comprising: scanning lines extending in a first direction, video signal lines extending in a second direction, a pixel electrode formed in an area surrounded by the scanning lines and the video signal lines; a transistor connected to the pixel electrode, a first insulating film formed on a source electrode of the transistor, a common electrode formed on the first insulating film, a second insulating film on the common electrode, the pixel electrode is formed on the second insulating film; wherein a first through hole is formed in the first insulating film, the pixel electrode connects with the source electrode via the first through hole, a common metal wiring made of metal is formed overlapping with a part of the common electrode, black resin exists in the first through hole, the black resin is formed overlapping with the video signal line in a plan view.

4 Claims, 10 Drawing Sheets

(51) Int. Cl.
*G02F 1/1335* (2006.01)
*G02F 1/1368* (2006.01)
*G02F 1/1333* (2006.01)
*H01L 27/12* (2006.01)

(52) U.S. Cl.
CPC .. *G02F 1/133512* (2013.01); *G02F 1/134309* (2013.01); *G02F 1/136209* (2013.01); *G02F 1/136227* (2013.01); *G02F 1/136286* (2013.01); *H01L 27/124* (2013.01); *G02F 1/134363* (2013.01); *G02F 2201/121* (2013.01); *G02F 2201/123* (2013.01)

(58) Field of Classification Search
CPC ............ H01L 27/3276; H01L 51/4284; G09G 3/3648; G09G 2300/0426
See application file for complete search history.

LIQUID CRYSTAL DISPLAY DEVICE

CLAIM OF PRIORITY

The present application claims priority from Japanese Patent Application JP 2017-157824 filed on Aug. 18, 2017, the content of which is hereby incorporated by reference into this application.

BACKGROUND OF THE INVENTION

(1) Field of the Invention

The present invention relates to a liquid crystal display device, in which the color filter and the black matrix are formed on the TFT substrate.

(2) Description of the Related Art

The liquid crystal display device has a TFT (Thin Film Transistor) substrate, a counter substrate opposing to the TFT substrate, and a liquid crystal layer sandwiched between the TFT substrate and the counter substrate. The TFT substrate has plural pixels arranged in matrix form; each of the pixels has a pixel electrode and a Thin Film Transistor (TFT). A transmittance of light in each of the pixels is controlled by liquid crystal molecules; thus, images are formed.

In a normal structure of the liquid crystal display device, the color filter is formed on the counter substrate. However, if the color filter is disposed on the counter substrate, there arises a problem of the color mixture when a misalignment between the counter substrate and the TFT substrate occurs. If the color filter and the black matrix are formed on the TFT substrate, the problem of the color mixture due to misalignment between the TFT substrate and the counter substrate can be removed. Patent document 1 (Japanese patent application laid open 2002-350886) discloses the structure where the color filter and the black matrix are formed on the TFT substrate.

SUMMARY OF THE INVENTION

According the screen becomes to have higher definition, a problem of the color mixture becomes conspicuous. Therefore, the structure of COA (Color Filter On Array), in which the color filter is formed on the TFT substrate, becomes an important technology. If the black matrix also is formed on the TFT substrate in the COA structure, the problem caused by the misalignment between the TFT substrate and the counter substrate can be almost solved.

The scanning lines and the video signal lines are formed on the TFT substrate. The scanning lines and the video signal lines are made of metals. Furthermore, the common metal wirings are formed on the common electrode to prevent a voltage drop in the common electrode, which is made of the transparent oxide conductive film of e.g. ITO (Indium Tin Oxide) and the like. Those metal wirings reflect the external light, which deteriorate the visibility of the screen.

Conventionally, the black matrix has been formed on the counter substrate to shield the external light to prevent the reflection of the metal wirings. When the black matrix is formed on the TFT substrate, there arises a problem how to prevent the reflection of the external light from those metal wirings.

The purpose of the present invention is, when the color filter and the black matrix are formed on the TFT substrate, how to prevent the reflection of the external light from the scanning lines, the video signal lines, common metal wirings and the source electrodes, to realize the high definition liquid crystal display device of less color mixture.

The present invention solves the above problem; the concrete structures are as follows.

(1) A liquid crystal display device comprising: scanning lines extending in a first direction, video signal lines extending in a second direction, a pixel electrode formed in an area surrounded by the scanning lines and the video signal lines, a transistor connected to the pixel electrode, a first insulating film formed on a source electrode of the transistor, a common electrode formed on the first insulating film, a second insulating film formed on the common electrode, the pixel electrode is formed on the second insulating film, wherein a first through hole is formed in the first insulating film, the pixel electrode connects with the source electrode via the first through hole, a common metal wiring made of metal is formed overlapping with a part of the common electrode in a plan view, black resin exists in the first through hole, the black resin is formed overlapping with the video signal line in a plan view.

(2) A liquid crystal display device comprising: scanning lines extending in a first direction, video signal lines extending in a second direction, a pixel electrode formed in an area surrounded by the scanning lines and the video signal lines, a transistor connected to the pixel electrode, a first insulating film formed on a gate electrode of the transistor, a source electrode, connecting with the transistor, formed on the first insulating film, a color filter formed over the source electrode and the first insulating film, an organic passivation film formed to cover the color filter, wherein a first through hole is formed in the color filter, a second through hole is formed, continuously with the first through hole, in the organic passivation film, a third through hole is formed in the organic passivation film so as to overlap with the video signal line in a plan view, a first black matrix is formed in the first through hole and the second through hole, a second black matrix is formed on the common metal wiring, which is formed in the third through hole, the common electrode is formed on the organic passivation film and the second black matrix, the first black matrix and the second black matrix are electrically conductive, the common metal wiring and the common electrode are electrically connected through the second black matrix.

(3) A liquid crystal display device comprising: scanning lines extending in a first direction, video signal lines extending in a second direction, a pixel electrode formed in an area surrounded by the scanning lines and the video signal lines, a transistor connected to the pixel electrode, a first insulating film formed on a gate electrode of the transistor, a source electrode, connecting with the transistor, formed on the first insulating film, a color filter formed over the source electrode and the first insulating film, a first organic passivation film formed to cover the color filter, a second organic passivation film formed on the first organic passivation film, a common electrode formed on the second organic passivation film, wherein a first through hole is formed in the color filter and the first organic passivation film, the source electrode connects with a pixel electrode in the first through hole, a second through hole is formed, continuously with the first through hole, in the second organic passivation film, a third through hole is formed in the second organic passivation film so as to overlap with the video signal line in a plan view, a common metal wiring is formed in the third through hole, the common electrode contacts with the common metal wiring in the third through hole, a first black matrix is formed in the first through hole and the second through hole, a second black matrix is formed in the third through hole.

DETAILED DESCRIPTION OF THE PREFERRED EMBODIMENTS

The present invention will be described in detail referring to the following embodiments.

Embodiment 1

Figure 1:
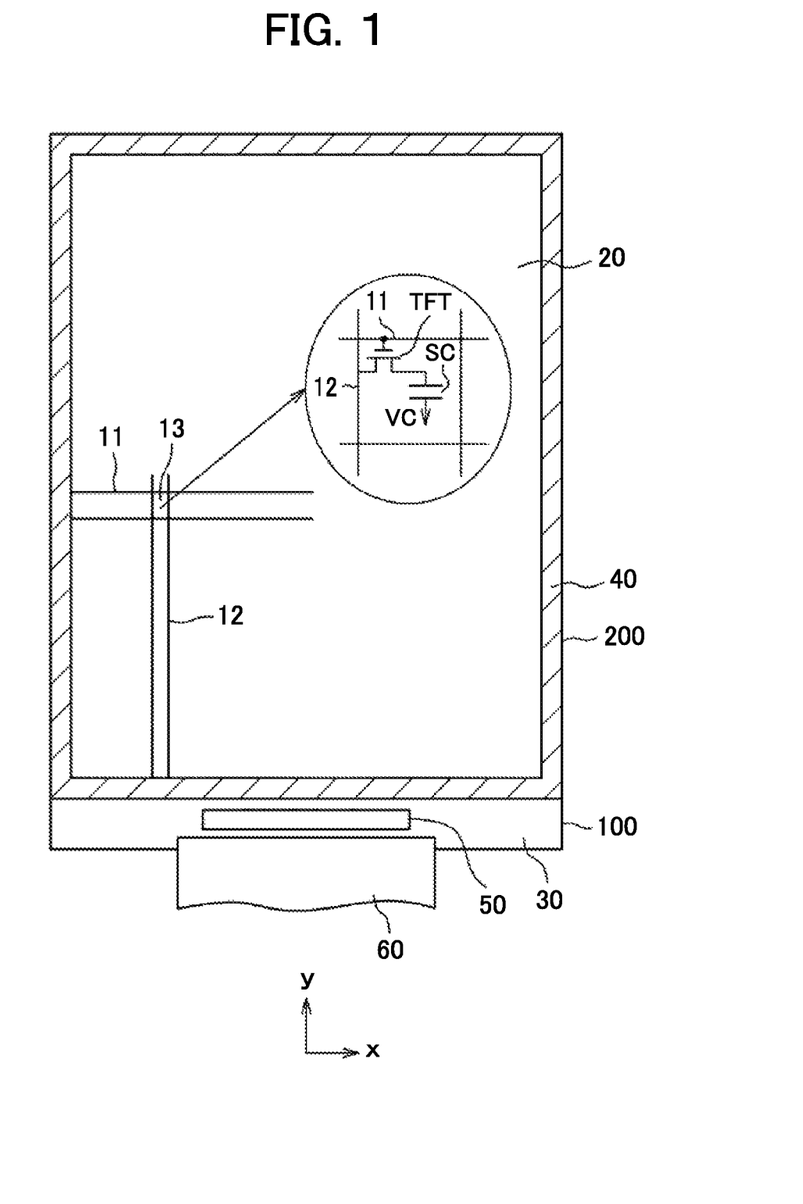
FIG. 1 is a plan view of the liquid crystal display device, which the present invention is applied.

FIG. 1 is a plan view of the liquid crystal display device, which the present invention is applied. In FIG. 1, the TFT substrate 100 and the counter substrate 200 are adhered by the sealing material 40; the liquid crystal is sandwiched between the TFT substrate 100 and the counter substrate 200. The display area 20 is formed in the area surrounded by the sealing material 40.

In the display area 20, the scanning lines 11 extend in the lateral direction (x direction) and are arranged in the longitudinal direction (y direction); the video signal lines 12 extend in the longitudinal direction and are arranged in the lateral direction. The pixel 13 is formed in the area surrounded by the scanning lines 11 and the video signal lines 12. The TFT and the liquid crystal, which is driven by the TFT, are formed in the pixel.

When the gate voltage is applied to the gate electrode of the TFT from the scanning line 11, the video signal is supplied from the video signal line 12 to the pixel electrode and stored in the storage capacitance SC. The liquid crystal is driven as far as the charges are stored in the storage capacitance SC. In FIG. 1, VC denotes the voltage of the common electrode.

The TFT substrate 100 is made bigger than the counter substrate 200, the portion of the TFT substrate 100 that does not overlap with the counter substrate 200 is the terminal area 30. The driver IC 50, which drives the liquid crystal panel, is installed in the terminal area 30; and the flexible wiring circuit substrate 60, which supplies the power, the video signals and the scanning signals and the like to the liquid crystal display panel, is connected to the terminal 30.

Figure 2:
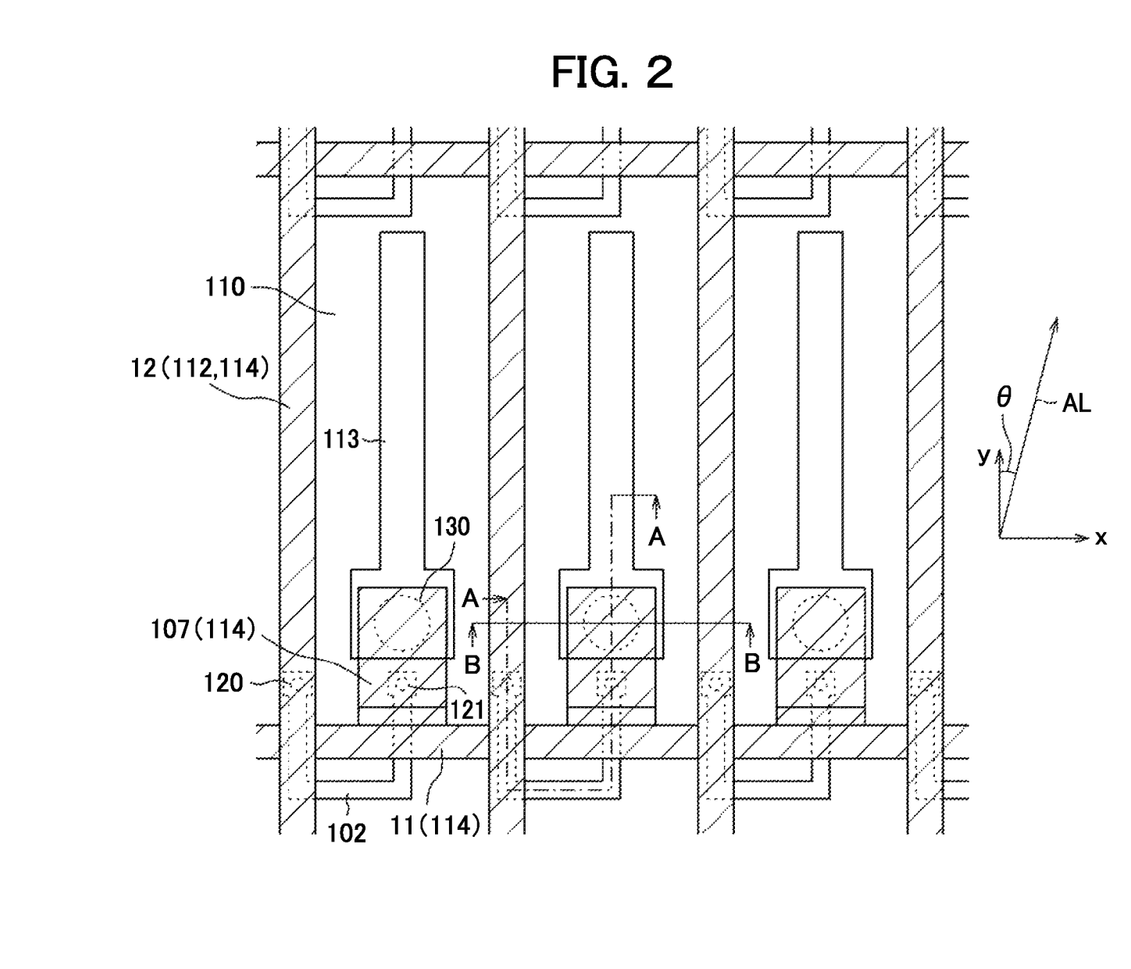
FIG. 2 is a plan view of the pixel area according to the present invention.

FIG. 2 is a plan view of the pixels on the TFT substrate 100 of the liquid crystal display device of FIG. 1. FIG. 2 is an example of IPS (In plane Switching) type liquid crystal display device. In FIG. 2, the scanning lines 11 extend in the lateral direction (x direction) and are arranged in the longitudinal direction (y direction); the video signal lines 12 extend in the longitudinal direction and are arranged in the lateral direction. The pixel electrode 113 is formed in the area surrounded by the scanning lines 11 and the video signal lines 12.

In FIG. 2, the semiconductor layer 102 is formed under the video signal line 12 and the scanning line 11. The semiconductor layer 102 is made of poly silicon. The semiconductor layer 102 connects with the video signal line 12 via the through hole 120, extends under the video signal line 12 and goes through under the scanning line 11. The first TFT is formed at this point. The semiconductor layer 102 bends twice and goes through under the scanning line 11 again and extends toward the pixel electrode 113. The second TFT is formed at this time. In other words, the scanning line 11 works as a gate electrode.

The semiconductor layer 102 connects with the source electrode 107 via the through hole 121. The source electrode 107 connects with the pixel electrode 113 via the through hole 130. Therefore, two TFTs are formed between the pixel electrode 113 and the video signal line 12, which is also called as a double gate structure. The through hole 130 is formed in the color filter and the organic passivation film.

Figure 3:
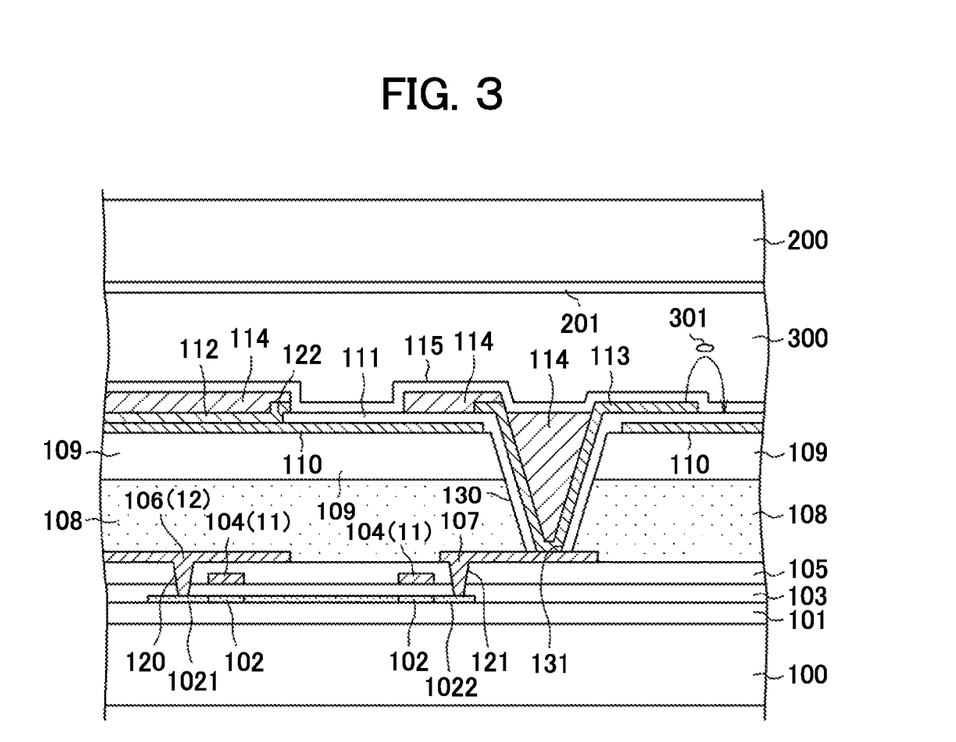
FIG. 3 is a cross sectional view of FIG. 2 along the line A-A.

In FIG. 2, the pixel electrode 113, which is stripe shaped, forms an electric field between the common electrode 110; the common electrode 110 is formed in plane under the capacitive insulating film 111 to be explained later; the electric field rotates the liquid crystal molecules to control a transmittance of the light from the back light in the pixel. In FIG. 3, since the pitch of the pixels in the direction (x direction) in which the scanning line 11 extends is as small as approximately 30 microns, the pixel electrode 113 is a stripe shaped; however, if a size of the pixel is bigger, the pixel electrode 113 can be a comb shaped electrode, which has a slit inside.

In FIG. 2, the stripe shaped pixel electrode 113 extends in y direction. The alignment direction of the alignment film, which determines the direction of initial alignment of the liquid crystal molecules, is denoted by an arrow AL. The alignment direction AL tilts with y direction in an angle θ. It is because to determine the direction of the rotations of the liquid crystal molecules when the field is applied. The angle θ is generally 5 degrees to 15 degrees. By the way, if the alignment direction is intended to be y direction, the extending direction of the pixel electrode 113 tilts with y direction in an angle θ; at the same time, the video signal line 12, too, tilts with y direction in an angle θ.

In FIG. 2, the common metal wiring 112 and the black matrix 114 are formed on the video signal line 12 overlapping in a plan view. Furthermore, the black matrix 114 is formed on the scanning line 11 overlapping in a plan view. In addition, the black matrix 114 is formed on the source electrode 107 overlapping in a plan view. As described above, the black matrix 114 is formed over the metal electrode or the metal wiring, which have high reflectivity, to overlap in a plan view; consequently, the reflection of the external light is suppressed.

FIG. 3, is a cross sectional view of FIG. 2 along the line A-A. In FIG. 3, the undercoat 101 is formed on the TFT substrate 100, which is made of e.g. glass. The liquid crystal display device can be made bendable by making the glass substrate as thin as 0.2 mm or less or by making the TFT substrate 100 by resin, like polyimide and the like.

The undercoat 101 prevents the semiconductor layer 102, which is formed later, from being contaminated by impurities in the glass substrate or in the resin substrate. The undercoat 101 is generally constituted by a laminated film of the silicon nitride film (herein after SiN film) and the silicon oxide film (herein after SiO film). The semiconductor layer 102 is formed on the undercoat 101. The semiconductor layer 102 is formed as that: an a-Si layer is formed by CVD at the outset, then the a-Si layer is transformed to the poly silicon layer by irradiating Excimer laser on the a-Si layer. By the way, the SiN film and the SiO film, which constitutes the undercoat 101 and the a-Si that is to be transformed to the semiconductor layer 102 are formed continuously by CVD.

After the semiconductor layer 102 is patterned, the gate insulating film 103 is formed to cover the semiconductor layer 102. The gate insulating film 103 is a SiO film that is formed by TEOS (Tetraethoxysilane) as the material. The gate electrode 104 is formed on the gate insulating film 103. The gate electrode 104 is made of e.g. MoW (Molybdenum Tungsten) alloy, which is formed by sputtering and then patterned. In the structure of FIG. 2, the scanning line 11 works as the gate electrode 104; the semiconductor layer 102 goes through under the scanning line 11 twice, thus, two TFTs are formed; consequently, in FIG. 3, two gate electrodes 104 are formed. In the meantime, if the scanning line 11 is required to be low resistance, the structure that an Al layer is sandwiched by Ti layers is adopted as described later with referring to FIG. 4.

After the patterning of the gate electrode 104, P (phosphor) or B (Boron) or the like are doped by ion implantation to give conductivity to the semiconductor layer 102 except the portion under the gate electrode 104; consequently, the drain region 1021 and the source region 1022 are formed in the semiconductor layer 102.

After that, the interlayer insulating film 105 is formed to cover the gate electrode 104; the interlayer insulating film 105 is formed by a SiN layer or a SiO layer, or a laminated film of the SiN layer and the SiO layer. The interlayer insulating film 105 can be formed by CVD. The drain region 1021 of the semiconductor layer 102 is connected to the video signal line 12 via through hole 120, which is formed in the interlayer insulating film 105 and the gate insulating film 103. In this case, the video signal line 12 becomes a drain electrode 106.

On the other hand, the source region 1022 of the semiconductor layer 102 is connected to the source electrode 107 via through hole 121, which is formed in the interlayer insulating film 105 and the gate insulating film 103. The source electrode 107 extends on the interlayer insulating film 105 to connect with the pixel electrode 113 in the through hole 130.

Figure 4:
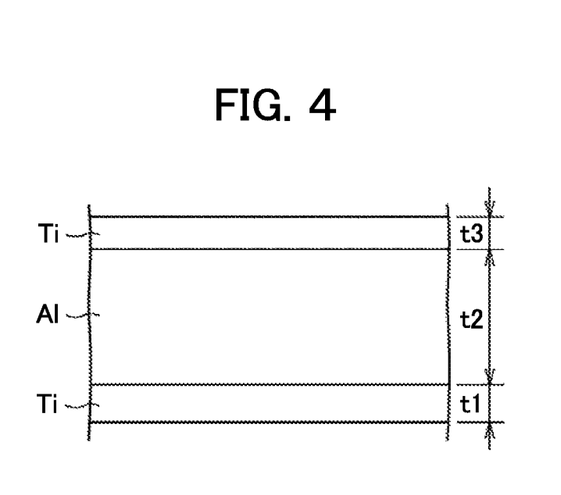
FIG. 4 is a cross sectional view of the video signal line.

The video signal line 12 and the source electrode 107 are made of the same material and formed simultaneously. FIG. 4 is an example of a cross section of the video signal line 12. As shown in FIG. 4, the video signal line 12 has a structure that an Aluminum (Al) layer is sandwiched by the base metal made of Titan (Ti) and the cap metal made of Titan (Ti). A thickness t1 of the base metal is e.g. 40 nm, a thickness t2 of Al is e.g. 130 nm and a thickness t3 of the cap metal is e.g. 30 nm. Al denotes an alloy that Al is a main substance. MoW may be used instead of Ti. Al, Ti, and the like are formed by sputtering.

In FIG. 3, the color filter 108 is formed covering the video signal line 12, the source electrode 107 and the interlayer insulating film 105. A thickness of the color filter 108 is e.g. 2 to 3 microns. The organic passivation film 109, which is e.g. made of acrylic, is formed over the color filter 108. A thickness of the organic passivation film 109 is e.g. 1 to 1.5 microns.

The through hole 130 is formed in the color filter 108 and the organic passivation film 109 to connect the source electrode 107 and the pixel electrode 113, which is formed later. FIG. 3 is a structure that the through hole 130 is formed in the color filter 108 and the organic passivation film 109 continuously. However, since the total thickness of the color filter 108 and the organic passivation film 109 is as thick as 3 to 4.5 microns, sometimes it is difficult to form the thorough hole continuously; in that case, through hole is formed by two steps as: a through hole in the organic passivation film 109 is formed first, then a through hole in the color filter 108 is formed.

The common electrode 110 is on the organic passivation film 109 in a plane shape. The common electrode 110 is removed from the through hole 130. After that, the capacitive insulating film 111 is formed by SiN. The capacitive insulating film 111 is so called because it forms a storage capacitance between the pixel electrode 113 and the common electrode 110. The through hole 131 is formed in the capacitive insulating film 111 in the through hole 130 to connect the pixel electrode 113 and the source electrode 107.

The common electrode 110 is made of ITO; however, since ITO has a larger resistance compared with metals, a voltage drop in the common electrode 110 tends to be a problem. To prevent this phenomenon, in FIG. 3, the through hole 122 is formed in the capacitive insulating film 111 to dispose the common metal wiring 112 in the through hole 122. The through hole 122 is formed in groove like. The cross sectional structure of the common metal wiring 112 is the same as the cross sectional structure of the video signal line 12 as depicted in FIG. 4. However, since it is only an example, the common metal wiring 112 can take a different structure from the video signal line 12.

The pixel electrode 113 is formed by ITO on the capacitive insulating film 111. The plan view of the pixel electrode 113 is depicted in FIG. 2. When the video signal is applied to the pixel electrode 113, the line of force depicted in FIG. 3 is generated between the plane shaped common electrode 110, which is formed under the capacitive insulating film 111; consequently, the liquid crystal molecules are rotated to control a transmittance of the light from the backlight, thus, images are formed.

As described above, the metal wirings and metal electrodes as e.g. the scanning lines 11, the video signal lines 12, the source electrodes 107, the common metal wirings 112, and the like are formed in a large area on the TFT substrate 100. Since the metals reflect light, this structure deteriorates the visibility of the screen.

To prevent this phenomenon, the present invention forms the black matrix 114 to cover the metal wirings and metal electrodes. As depicted in FIG. 3, the black matrix 114 is formed to cover the common metal wirings 112, the video signal lines 12, the scanning lines 11, the source electrodes 107, and the like. The feature of FIG. 3 is that the through hole 130 is filled with the black matrix 114.

Figure 5:
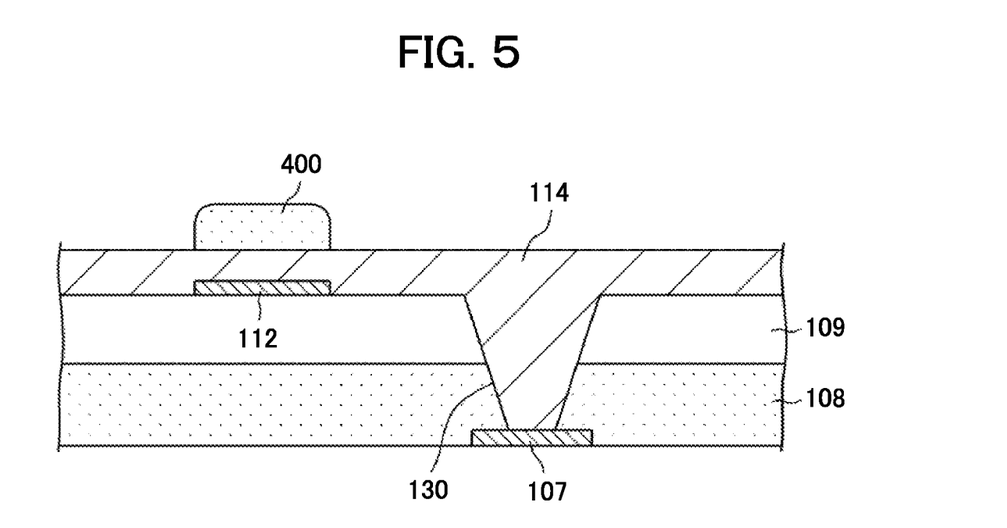
FIG. 5 is a cross sectional view in a process to form the black matrix.
Figure 6:
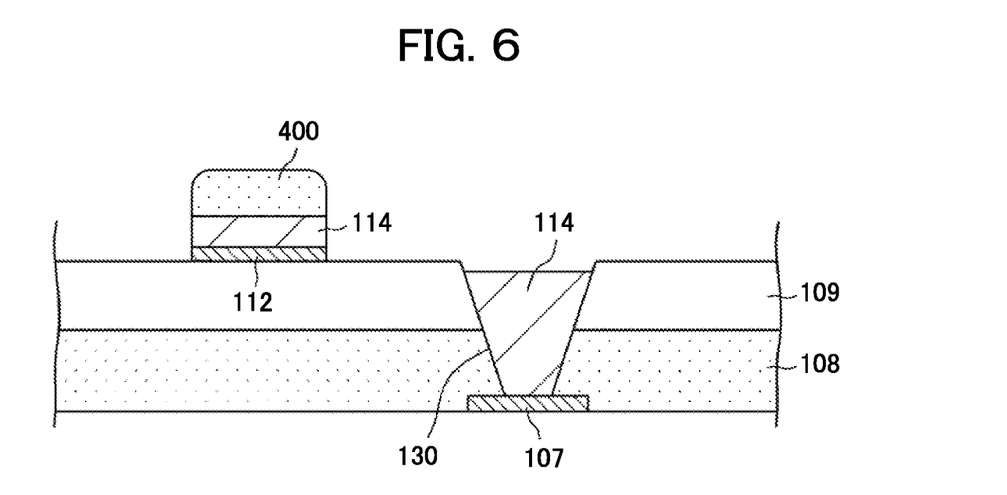
FIG. 6 is a cross sectional view in a process to form the black matrix following FIG. 5.

FIG. 5 and FIG. 6 are cross sectional views how the black matrix 114 is patterned in the present invention. The structures are simplified in FIG. 5 and FIG. 6 for easy understanding of the processes, thus, the structures of FIGS. 5 and 6 are a little bit different from the structure of FIG. 2. In FIG. 5, the color filter 108 is formed over the source electrode 107; the organic passivation film 109 is formed on the color filter 108. The through hole 130 is formed in the color filter 108 and the organic passivation film 109.

The common metal wirings 112 made of metal are formed on the organic passivation film 109. The black matrix 114 is formed covering the common metal wirings 112 and the organic passivation film 109. The black matrix is liquid before it is baked and hardened; when the liquid black matrix material is coated, it flows into the through hole 130, furthermore, the surface of the black matrix 114 is made flat because of leveling effect. The resist 400 is formed on the black matrix 114 at the position corresponding to the common metal wirings 112.

The black matrix 114 is made of black resin formed as that: for example, the resin as acrylic resin, and the like is dispersed with carbon, or dispersed with the mixed pigments for three colors. By the way, polyimide can be used for the resin. In the processes explained below, the black matrix 114 is patterned using resist 400; however, if the photo sensitive resin is used, formation of resist can be eliminated.

After that, the black matrix 114 is patterned by etching using etching solution. FIG. 6 is a cross sectional view of the black matrix 114 after it is patterned by etching. Feature of FIG. 6 is that the black matrix 114 is formed in the through hole 130, where the resist has not been formed. Since a depth of the through hole 130 is as deep as 3 to 4.5 microns, the black matrix 114 in the through hole 130 is not removed completely, but remains in the through hole 130 even the resist 400 is not formed. The present invention actively utilizes this phenomenon, namely, intentionally leave the black matrix 114 in the through hole 130, thus, prevents a reflection from the source electrode 107. In other words, the feature of FIGS. 5 and 6 is that the resist 400 is formed at the portion, other than the through hole 130, where the black matrix 114 is intended to remain; however, the resist 400 is not necessary at the through hole 130.

Back to FIG. 3, the counter substrate 200 is disposed opposing to the TFT substrate 100 sandwiching the liquid crystal layer 300. In FIG. 3, since the color filter 108 and black matrix 114 are formed on the TFT substrate 100, only the alignment film 201 for the initial alignment of the liquid crystal molecules is formed on the counter substrate 200. Therefore, the alignment accuracy between the TFT substrate 100 and the counter substrate 200 does not raise a problem.

Figure 7:
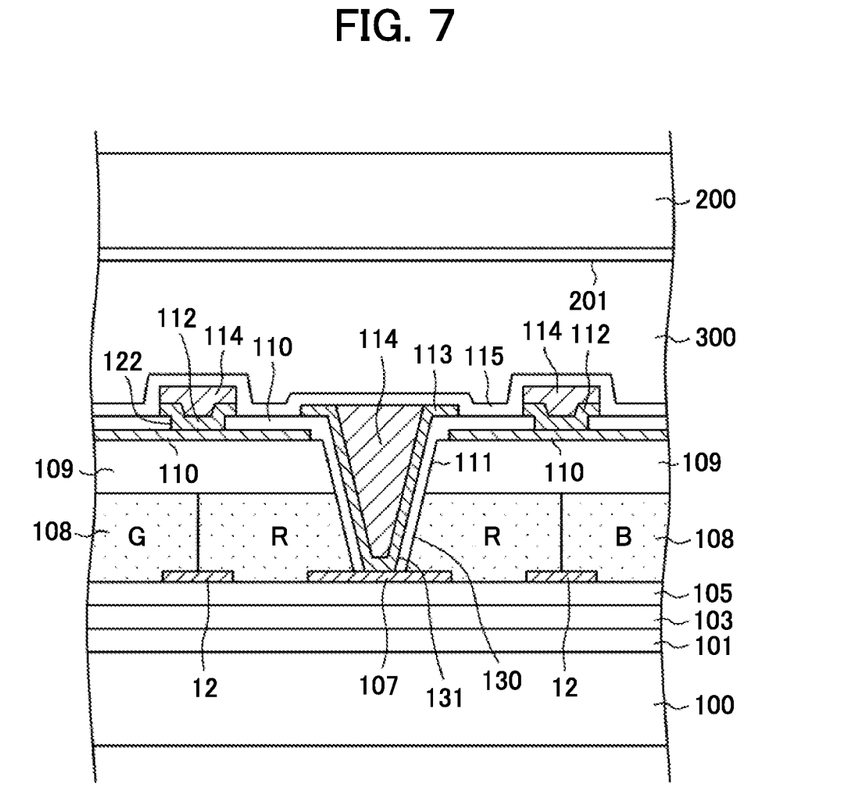
FIG. 7 is a cross sectional view of FIG. 2 along the line B-B.

FIG. 7 is a cross sectional view of FIG. 2 along the line B-B. In FIG. 7, the source electrode 107 and the video signal line 12 are formed on the interlayer insulating film 105. The color filter 108 is formed over the video signal line 12, the source electrode 107, the interlayer insulating film 105 and the like; the organic passivation film 109 is formed on the color filter 108. In FIG. 7, pixels are partitioned at the center of the video signal line 12. Therefore, the color filter 108 is separated at the center of the video signal line 12. In FIG. 7, the red color filter R is on the center, the green color filter G is on the left, and the blue color filter B is on the right.

After that the through hole 130 is formed in the color filter 108 and the organic passivation film 109. The common electrode 110 is formed on the organic passivation film 109; the capacitive insulating film 111 is formed on the common electrode 109; the pixel electrode 113 is formed on the capacitive insulating film 111. In FIG. 7, the through hole 112 is formed in the capacitive insulating film 111; the common metal wiring 112 is formed in the through hole 112. The through hole 122 and the common metal wiring 112 extend in the vertical direction to the sheet. The common metal wiring 112 connects with the common electrode 110 to prevent the voltage drop in the common electrode 110.

In FIG. 7, the black matrix 114 is formed on the common metal wiring 112 and in the through hole 130. The manufacturing method of the black matrix 114 is the same as explained in FIG. 5 and FIG. 6. Since the video signal line 12 and the common metal wiring 112 overlap in a plan view, the black matrix 114 simultaneously prevents the reflections both from the video signal line 12 and the common metal wiring 112. The black matrix 114 in the through hole 130 prevents the reflection from the source electrode 107. After that, the alignment film 115 is formed covering the black matrix 114, capacitive insulating film 111, the pixel electrode 113, etc. Other structures are the same as explained in FIG. 3.

In FIG. 3 and FIG. 7, the common metal wiring 112 connects with the common electrode 110 via the through hole 122 formed in the capacitive insulating film 111. The connection between the common metal wiring 112 and the common electrode 110, however, is not limited by this structure. For example, the common metal wiring 112 can be directly formed on the common electrode 110; then, the capacitive insulating film 111 is formed to cover the common metal wiring 112. Alternatively, the common metal wiring 112 can be formed on the organic passivation film 109 before the common electrode 110 is formed; then the common electrode 110 is formed on the common metal wiring 112. In any events, any structure is available as far as that the black matrix covers both of the common metal wiring 112 and the video signal line 12 in a plan view.

As described above, according to the present invention, all of the surfaces of the metals as the video signal lines 12, the common metal wirings 112, the scanning lines 11, the source electrodes 107 and the like are all covered by the black matrix 114 in a plan view; thus, the liquid crystal display device of excellent visibility and less reflection of external light can be realized.

Embodiment 2

Figure 8:
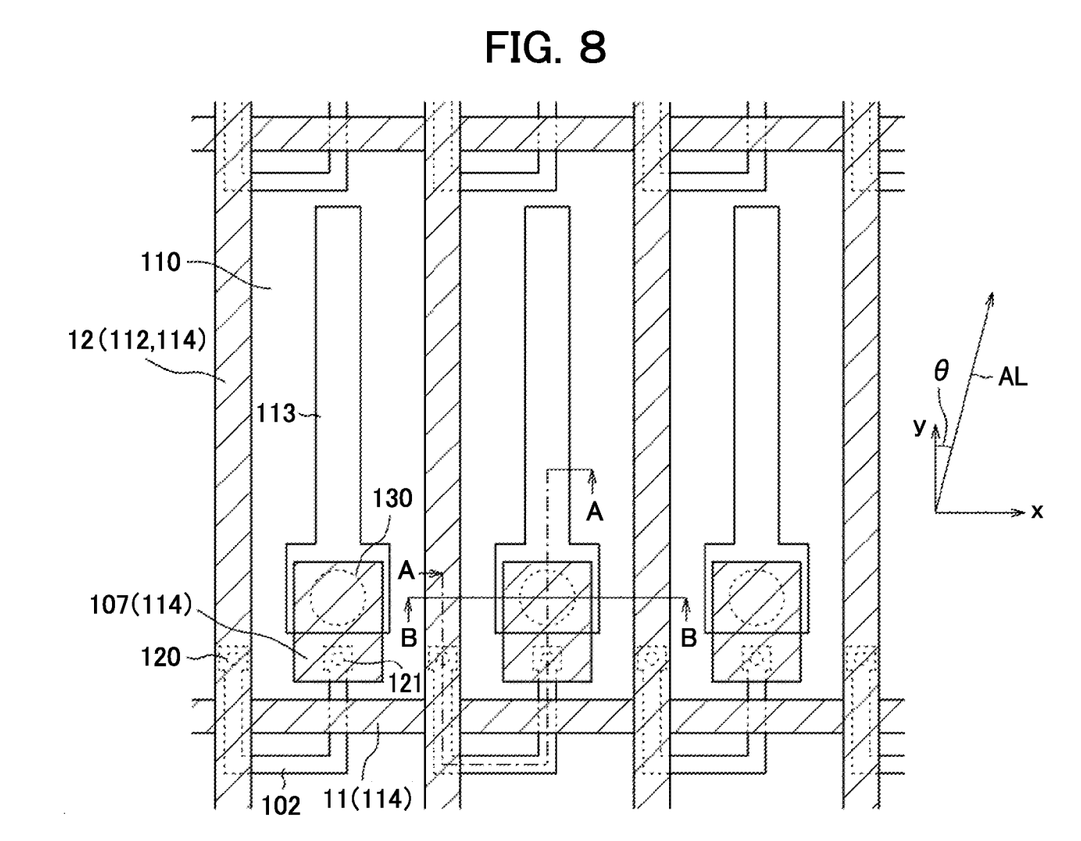
FIG. 8 is a plan view of the pixel area according to the embodiment 2.

FIG. 8 is a plan view of the pixels according to the embodiment 2. The embodiment 2 differs from the embodiment 1 in that the electrically conductive black matrix 114 is used in the embodiment 2. In FIG. 8, too, the black matrix 114 is formed to cover the source electrode 107 in a plan view. In FIG. 8, however, the black matrix 114, which covers the source electrode 107, is in the same potential as the source electrode 107, therefore, the common electrode 110 is formed to avoid the black matrix 114 formed on the source electrode 107. The black matrix 114 that covers the source electrode 107 is separated from the black matrix 114 that covers the scanning line 11. The reason is that the video signal is applied to the black matrix 114 that covers the source electrode 107 while the common voltage is applied to other black matrix 114. Other structure of FIG. 8 is the same as the structure of FIG. 2.

Figure 9:
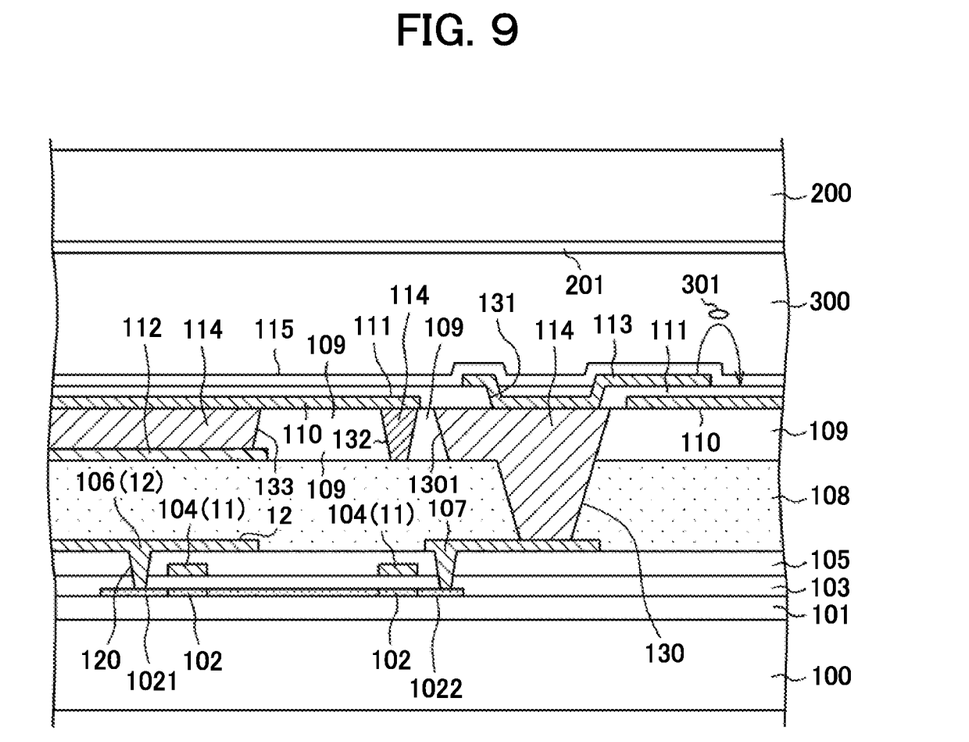
FIG. 9 is a cross sectional view of FIG. 8 along the line A-A.

FIG. 9 is a cross sectional view of FIG. 8 along the line A-A. FIG. 9 is the same as the structure of the embodiment 1 up to the color filter 108 is formed. In FIG. 9, the common metal wiring 112 is formed so as to overlap with the video signal line 12 in a plan view after the color filter 108 is formed. After that, the organic passivation film 109 is formed. After the organic passivation film 109 is formed, the through holes 1301, 132 and 133 are formed in the organic passivation film 109. The through hole 133 is formed at the place corresponding to the video signal line 12 in a plan view. The through hole 132 is formed at the place corresponding to the scanning line 11 in a plan view. The through hole 1301 is formed at the place corresponding to the source electrode 107 in a plan view.

In FIG. 9, the common metal wiring 112 is formed at the bottom of the through hole 133; the black matrix 114 is formed on the common metal wiring 112. The common electrode 110 is formed over the black matrix 114 and the organic passivation film 109. As described above, the common metal wiring 112 and the common electrode 110 are connected by the electrically conductive black matrix 114.

The black matrix 114 is formed in the through hole 132, too; the black matrix 114 at this position is formed to cover the scanning line 11. The through hole 1301, which is formed in the organic passivation film 109, is formed so as to cover the source electrode 107 in a plan view. After that, the through hole 130 is formed in the color filter 108; the conductive black matrix 114 is filled in the through holes 130 and 1301.

In FIG. 9, the capacitive insulating film 111 is formed over the common electrode 110; the through hole 1301 is formed in the capacitive insulating film 111 at the position of the black matrix 114 in the through hole 130 to make the connection between the pixel electrode 113 and the source electrode 107. After that, the pixel electrode 113 is formed by ITO. Then, the alignment film 115 is formed. Other structures of FIG. 9 are the same as the structures of FIG. 3 of the embodiment 1.

Figure 10:
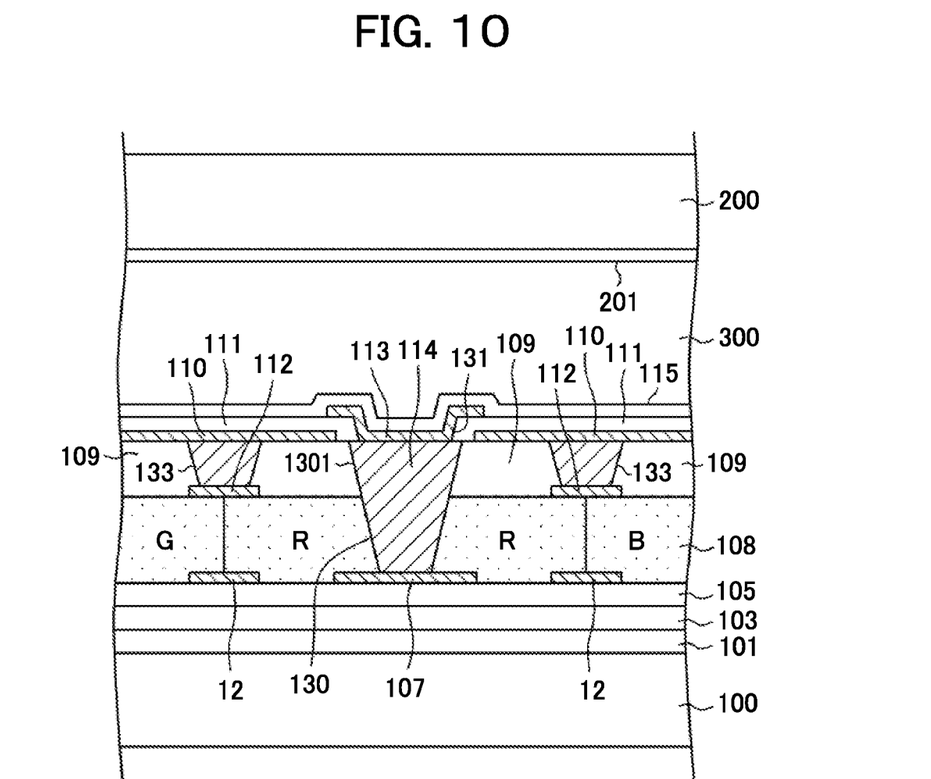
FIG. 10 is a cross sectional view of FIG. 8 along the line B-B.

FIG. 10 is a cross sectional view of FIG. 8 along the line B-B. FIG. 10 is the same as the structure in FIG. 7 of the embodiment 1 up to the color filter 108 is formed. In FIG. 10, the common metal wiring 112 is formed so as to overlap with the video signal line 12 in a plan view after the color filter 108 is formed. After that the organic passivation film 109 is formed. After the through holes 1301 and 133 are formed in the organic passivation film 109, the through hole 130 is formed in the color filter 108.

After that, the conductive black matrix 114 is filled in the through holes 1301, 130 and 133. Then, the common electrode 110 made of ITO is formed on the organic passivation film 109. Since the common electrode 110 is formed to cover the conductive black matrix 114, the common metal wiring 112 and the common electrode 110 are electrically connected.

After that, the capacitive insulating film 111 is formed to cover the common electrode 110. The through hole 131 is formed in the capacitive insulating film 111 on the conductive black matrix 114 formed in the through hole 1301; thus, the electrical connection is taken between the pixel electrode 113 and the source electrode 107. After that, the pixel electrode 113 is formed to cover the through hole 1301. Then, the alignment film 115 is formed to cover the pixel electrode 113 and the capacitive insulating film 111. The Subsequent processes are the same as explained in FIG. 7.

As described above, in the embodiment 2, too, all of the surfaces of the metals as the video signal lines 12, the common metal wirings 112, the scanning lines 11, the source electrodes 107, and the like are all covered by the black matrix 114 in a plan view; thus, the liquid crystal display device of excellent visibility and less reflection of external light can be realized.

Embodiment 3

Figure 11:
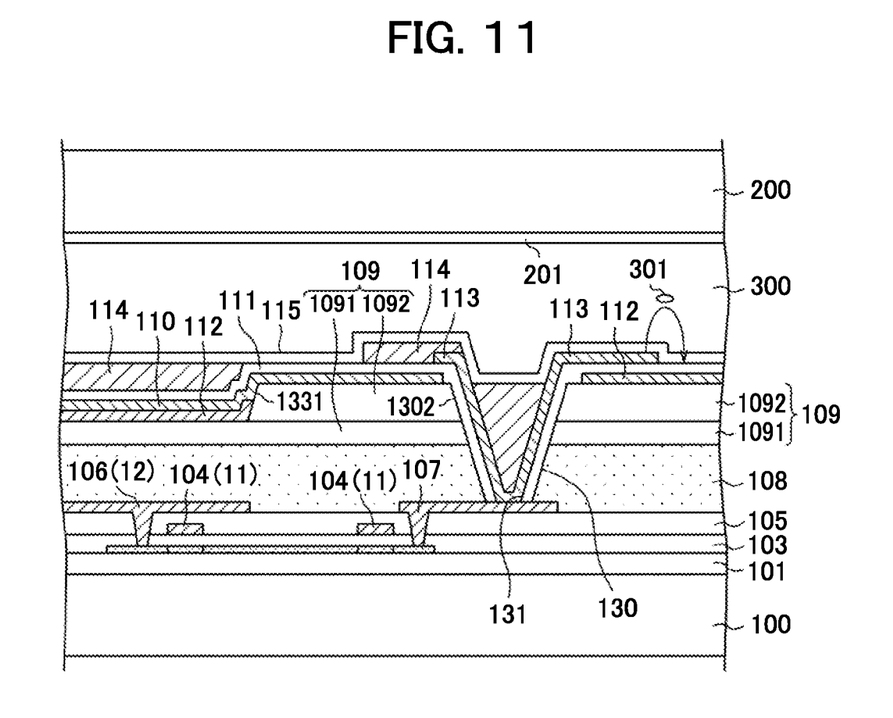
FIG. 11 is a cross sectional view of FIG. 2 along the line A-A according to the embodiment 3.

The plan view of the pixels in the embodiment 3 is the same as FIG. 2 of the embodiment 1. FIG. 11 is a cross sectional view of FIG. 2 along the A-A line according to the embodiment 3. FIG. 11 is the same as the structure of FIG. 3 of the embodiment 1 up to the color filter 108 is formed. In FIG. 11, the organic passivation film 109 formed on the color filter 108 is a two layer structure of the lower layer 1091 and the upper layer 1092.

After the upper organic passivation film 1092 is formed, the through holes 1331 and 1302 are formed in the upper organic passivation film 1092. After that, the through hole 130 is formed in the lower organic passivation film 1091 and in the color filter 108; then, common metal wiring 112 is formed in the through hole 1331. Subsequently, the common electrode 110 made of ITO is formed to cover the common metal wiring 112 and the upper organic passivation film 1091. The common metal wiring 112 and the common electrode 110 are electrically connected at the through hole 1331.

After that, the capacitive insulating film 111 is formed by SiN. The through hole 131 is formed in the capacitive insulating film 111 in the through hole 130 to make connection between the pixel electrode 113 and the source electrode 107. Then, the pixel electrode 113 is formed on the capacitive insulating film 111. After that, the black matrix 114 is formed on the pixel electrode 113 in the through holes 130 and 1302. Furthermore, the black matrix 114 is formed outside of the through hole 1302 to cover the source electrode 107 and the scanning line 11 in a plan view; thus, the reflections from the source electrode 107 and the scanning line 11 are prevented.

In FIG. 11, the black matrix 114 is filled in the through hole 1331 on the capacitive insulating film 111. Thus, the reflection from the common metal wiring 112 and the video signal line 12 is prevented. The manufacturing method of the black matrix 114 in the through hole 1331 is the same as explained in FIG. 5 and FIG. 6.

Figure 12:
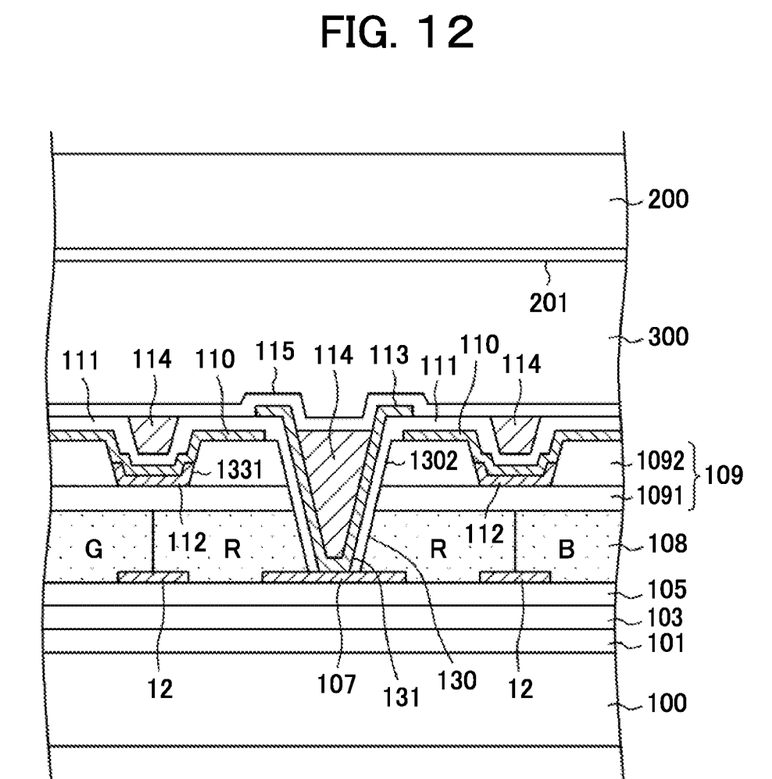
FIG. 12 is a cross sectional view of FIG. 2 along the line B-B according to the embodiment 3.

FIG. 12 is a cross sectional view of FIG. 2 along the B-B line according to the embodiment 3. FIG. 12 is the same as the structure of FIG. 7 of the embodiment 1 up to the color filter 108 is formed. In FIG. 12, the lower organic passivation film 1091 and the upper organic passivation film 1092 are formed on the color filter 108. After that, the through hole 1331 and the through hole 1302 are formed in the upper organic passivation film 1092. The through hole 1331 is a groove like through hole that extends in a vertical direction to the sheet. Subsequently, the through hole 130 is formed in the lower organic passivation film 1091 and in the color filter 108.

After that, the common metal wiring 112 is formed in the through hole 1331. Then, the common electrode 110 is formed to cover the common metal wiring 112 and the upper organic passivation film 1092. The capacitive insulating film 111 is formed by SiN to cover the common electrode 110. The through hole 131 is formed in the capacitive insulating film 111 in the through hole 130 to enable electrical connection between the pixel electrode 113 and the source electrode 107.

After that, the black matrix 114 is filled in the through hole 130 and through hole 1331. The black matrix 114 filled in the through hole 130 prevents the reflection from the source electrode 107. The black matrix 114 filled in the through hole 1331 prevents the reflection from the common metal wiring 112 and the video signal line 12. After that, the alignment film 115 is formed. The subsequent processes are the same as explained in FIG. 7. The manufacturing method of the black matrix is the same as explained in FIG. 5 and FIG. 6.

In FIG. 11 and FIG. 12, the through hole 1331 is formed in the upper organic passivation film 1092 at a position overlapping the video signal line 12 in a plan view. In FIG. 11 and FIG. 12, the common metal wiring 112 is formed under the common electrode 110 in the through hole 1331; however it is possible that the common electrode 110 is formed first, then the common metal wiring 112 is formed in the through hole 1331.

As described above, in the embodiment 3, too, all of the surfaces of the metals e.g. the video signal lines 12, the common metal wirings 112, the scanning lines 11, the source electrodes 107, and the like are all covered by the black matrix 114 in a plan view; thus, the liquid crystal display device of excellent visibility and less reflection of external light can be realized.

In the embodiment 1 through the embodiment 3, an integral effect can be expected even in a structure that the black matrix 114 covers only the common metal wiring 112 and the through hole 130, which are not covered by the color filter 108. It is because the video signal line 12 and a part of the source electrode 107 are covered by the color filter 108, thus, the reflection of external light is mitigated.

In the embodiment 1 through the embodiment 3, the poly silicon is used for the semiconductor layer 102, however, the oxide semiconductor or amorphous silicon (a-Si) are also applicable for the semiconductor layer 102. The structure of the TFT is not limited to the top gate; the bottom gate TFT is also applicable, too. In the embodiment 1 through the embodiment 3, the common electrode 110 is formed under the pixel electrode 113; however, the present invention is applicable to the structure that the pixel electrode 113 is formed under the common electrode 110.

What is claimed is:

1. A liquid crystal display device comprising:
   scanning lines extending in a first direction,
   video signal lines extending in a second direction,
   a pixel electrode formed in an area surrounded by the scanning lines and the video signal lines,
   a transistor connected to the pixel electrode,
   a first insulating film formed on a source electrode of the transistor,
   a common electrode formed on the first insulating film,
   a second insulating film formed on the common electrode,
   the pixel electrode is formed on the second insulating film,
   wherein a first through hole is formed in the first insulating film, the pixel electrode connects with the source electrode via the first through hole,
   a common metal wiring made of metal is formed overlapping with a part of the common electrode in a plan view,
   black resin exists in the first through hole,
   the black resin is formed overlapping with the video signal line in a plan view,
   wherein the common metal wiring connects with the common electrode via a second through hole formed in the second insulating film.

2. The liquid crystal display device according to claim 1, wherein the common metal wiring is formed to overlap with the video signal line in a plan view, the black resin covers the video signal line in a plan view.

3. The liquid crystal display device according to claim 1, wherein the black resin is formed on the second insulating film,
   the black resin formed on the second insulating film covers the source electrode.

4. The liquid crystal display device according to claim 1, wherein the black resin is formed on the second insulating film,
   the black resin formed on the second insulating film covers the scanning line.

* * * * *